US009151286B2

(12) United States Patent
Funk et al.

(10) Patent No.: US 9,151,286 B2
(45) Date of Patent: Oct. 6, 2015

(54) PROCESSING CHAMBER INTEGRATED PRESSURE CONTROL

(75) Inventors: Merritt Funk, Austin, TX (US); Lee Chen, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 314 days.

(21) Appl. No.: 13/606,689

(22) Filed: Sep. 7, 2012

(65) Prior Publication Data
US 2013/0115110 A1 May 9, 2013

Related U.S. Application Data

(60) Provisional application No. 61/556,176, filed on Nov. 4, 2011.

(51) Int. Cl.
F04B 49/06 (2006.01)
C23C 16/44 (2006.01)
H01L 21/67 (2006.01)
F04D 19/04 (2006.01)
F04D 27/02 (2006.01)

(52) U.S. Cl.
CPC ............ *F04B 49/06* (2013.01); *C23C 16/4412* (2013.01); *F04D 19/042* (2013.01); *F04D 27/0246* (2013.01); *H01L 21/67017* (2013.01); *H01L 21/67253* (2013.01)

(58) Field of Classification Search
CPC ... F04D 27/0253; F04D 19/04; F04D 19/042; C23C 16/4412; C23C 16/455; H01L 21/67017; H01L 21/67253; F04B 49/06
USPC ........................ 417/355, 356, 423.4; 415/157; 156/345.24, 345.36; 118/50, 715
See application file for complete search history.

(56) References Cited

U.S. PATENT DOCUMENTS

| | | | | |
|---|---|---|---|---|
| 2,949,540 A * | 8/1960 | Clayton | ...................... | 290/40 R |
| 3,075,742 A * | 1/1963 | Aldag | ............................ | 415/146 |
| 7,140,833 B2 | 11/2006 | Bailey | | |
| 7,718,030 B2 | 5/2010 | Funk et al. | | |
| 2003/0124001 A1* | 7/2003 | Chen | ............................. | 417/356 |
| 2005/0046285 A1* | 3/2005 | Minato et al. | .................... | 310/63 |
| 2006/0225648 A1* | 10/2006 | Rasheed et al. | ............... | 118/692 |
| 2006/0257243 A1* | 11/2006 | Moriya et al. | .................. | 415/90 |
| 2014/0369809 A1* | 12/2014 | Beyer et al. | ..................... | 415/65 |

* cited by examiner

*Primary Examiner* — Charles Freay
(74) *Attorney, Agent, or Firm* — Wood, Herron & Evans, LLP

(57) ABSTRACT

An apparatus and method for controlling pumping characteristics within a semiconductor processing chamber are provided. The apparatus includes levitation of a hollow shaft turbo pump or pump elements, and is configured to control pumping by including adjustments for orientation, position, geometries, and other aspects of the turbo pump. The method includes adjusting design and operational parameters, to control pumping characteristics within the processing chamber.

14 Claims, 5 Drawing Sheets

PROCESSING CHAMBER INTEGRATED PRESSURE CONTROL

CROSS-REFERENCE TO RELATED APPLICATIONS

Pursuant to 37 C.F.R. §1.78(a)(4), this application claims the benefit of and priority to prior filed Provisional Application Ser. No. 61/556,176, filed Nov. 4, 2011, which is expressly incorporated herein by reference.

FIELD OF THE INVENTION

The invention relates to semiconductor wafer processing chambers. More specifically, the invention relates to a vacuum pump and pressure control system for a processing chamber.

BACKGROUND OF THE INVENTION

Typically, during semiconductor processing, a carefully controlled processing environment is established within a processing chamber. Temperature, pressure, gas content, and other aspects of the processing chamber are regulated and adjusted to optimize conditions for a given operation. Many substrate processing recipes necessitate an extremely low pressure environment within the processing chamber. This has traditionally been accomplished by externally mounting a turbine-type pump mechanism, known as a "turbo pump."

In existing systems, chamber pressure may be manipulated by adjusting the rotational speed of the turbo pump. However, such configurations do not allow substantial flexibility in pressure profiles, since the only adjustable variable is the operating speed of the pump. Additionally, adjustment options are further limited because the location of the vacuum port is usually confined to a fixed location which penetrates the wall of the processing chamber.

Therefore, a processing chamber with improved vacuum pumping control features is needed.

SUMMARY OF THE INVENTION

In accordance with the present invention, a semiconductor fabrication apparatus with integrated processing chamber pressure control is provided. The apparatus includes a substrate processing chamber configured to perform one or more processes in semiconductor fabrication, and the substrate processing chamber has a pumping system integrated within it. The pumping system is concentrically mounted within the substrate processing chamber and movable axially within the substrate processing chamber. The pumping system includes a turbo pump suspended inside of the substrate processing chamber. The turbo pump has a hollow central shaft and one or more stages. Each of the one or more stages has stator vanes fixed relative to the pumping system and compressor vanes rotatable about a central axis of the stator vanes. A pressure control system is coupled to the turbo pump, and is configured to adjust the pressure within the substrate processing chamber by changing the relative motion or position of the pump or other components relative to the chamber.

Additionally, a method for integrating and controlling a pumping system within a substrate processing chamber is provided. The pumping system includes a turbo pump having a hollow central shaft with a center axis and one or more stages of paired stator vanes and compressor vanes, and a levitation system coupled to the turbo pump. The method includes selecting parameters for the pumping system to achieve processing objectives for a target process including a target pressure within the substrate processing chamber. The parameters include pumping position and location within a processing chamber, number of stages, type of levitating system, angle and geometry of vanes, rotational speed of each stage, and twisting of vanes. The method further includes assembling the pumping system in a selected location inside the substrate processing chamber, and adjusting the parameters of the pumping system according to the processing objectives.

DETAILED DESCRIPTION OF EXEMPLARY EMBODIMENTS

A processing chamber integrated pressure control method and apparatus are disclosed in various embodiments. However, one skilled in the relevant art will recognize that the various embodiments may be practiced without one or more of the specific details, or with alternative methods, materials, or components. Well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced with alternative specific details. Furthermore, the various embodiments shown in the figures are illustrative representations and are not necessarily drawn to scale.

References throughout this specification to "one embodiment" or "an embodiment" or "certain embodiments" or variations thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" or "in certain embodiments" in various places throughout this specification are not necessarily referring to the same embodiment of the invention. Furthermore, the particular features, structures, materials, or characteristics may be combined in any suitable manner in one or more embodiments. Nonetheless, it should be appreciated that, contained within the description are features which, notwithstanding the inventive nature of the general concepts being explained, are also of an inventive nature.

Figure 1:
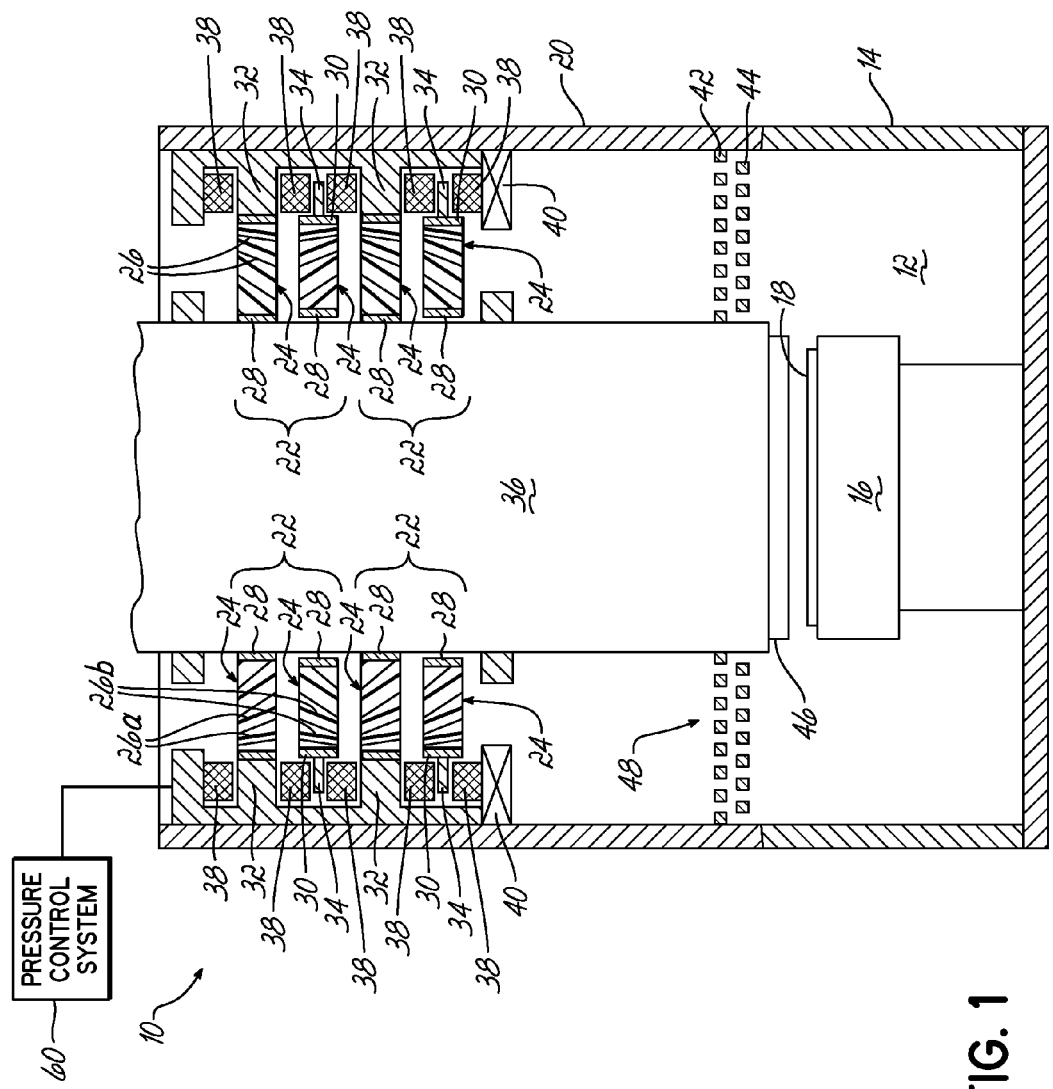
FIG. 1 is a cross sectional view of one embodiment of the disclosed processing chamber integrated pressure control, with movable pump and plate valve in a first position.

Referring now to the drawings, wherein like reference numerals designate identical or corresponding parts throughout the several embodiments or several views, FIG. 1 illustrates a semiconductor fabrication apparatus 10 with integrated processing chamber pressure control according to certain embodiments of the invention. The apparatus 10 includes a processing space 12 formed by a gas-tight chamber wall 14. A substrate holder 16 is disposed at one end of the processing space 12, and is configured to receive a substrate 18 during processing operations. A pump cylinder 20 is situated at the other end of the processing space 12, and includes one or more stages 22 of vane assemblies 24. The vane assemblies 24 comprise a plurality of vanes 26, which radiate outwardly from a center ring 28 to a perimeter ring 30 in a traditional turbine fan pattern. Each vane assembly 24 has a central axis coincident with the center-line of the center ring 18 and perimeter ring 30. Each stage 22 is comprised of at least two vane assemblies 24, wherein one or more of the vane assemblies 24 is a non-rotating stator 32, and one or more of the vane assemblies 24 is a rotating compressor 34. Stators 32 include stator vanes 26a, and compressors include compressor vanes 26b. The center rings 28 of the stators 32 are conjoined to form a hollow shaft 36, but in other embodiments, the shaft is solid. Alternatively, stators 32 may be mounted by conjoining perimeter rings 30, or by a combination of conjoined center rings 28 or perimeter rings 30. The one or more stages 22 of vane assemblies 24 may be referred to as a turbo pump, wherein increasing or decreasing the number of stages serves to vary the pumping characteristics of the turbo pump.

The compressors 34 are levitated and driven by magnetic linear motors 38. In some embodiments, the linear motors 38 form a ring along the outer circumference of the hollow shaft 36, and in other embodiments the linear motors 38 are disposed in rings along the interior face of the pump cylinder 20. In use, magnetic linear motors 38 prevent the compressors 34 from contacting any other structure of the processing chamber integrated pressure control 10. The magnetic linear motor 38 may include permanent magnets, electromagnets, or both. Additionally, some magnets may be configured to produce levitating forces, while others are configured to impart rotation to the compressor 34. In the alternative, electromagnets may be configured to simultaneously provide levitating and rotational forces.

This levitating configuration eliminates part-on-part frictional forces, prevents generation of particulate matter caused by abrading components, and reduces vibrational transfer from the rotating compressors 34 to other structures in the apparatus 10. The entire stack of one or more stages 22 and accompanying linear motors 38 may be isolated from the pump cylinder 20 by magnetic cylinder bearings 40. Alternatively, the entire stack of one or more stages 22 and accompanying linear motors 38 may be mounted in physical contact with the pump cylinder 20. The magnetic cylinder bearings 40, or their non-magnetic counterparts, may be configured to translate vertically along the interior face of the pump cylinder 20. The linear translation adjusts the effective volume of the processing space 12, and thus serves to adjust pumping characteristics.

In one embodiment, a first plate 42 and a second plate 44 are disposed above a showerhead 46. The first plate 42 and second plate 44 cooperate to form a valve mechanism. The first plate 42 and second plate 44 may be perforated, slotted, or may include a grid wherein a geometric pattern of material has been removed from the plates 42 and 44. The first plate 42 and second plate 44 may contain identically configured patterns of removed material. In other embodiments, the first plate 42 may be configured to be substantially inverse from the second plate 44, wherein when plates 42 and 44 are stacked, the removed regions of the first plate 42 correspond to the solid regions of the second plate 44. Depending on the geometric pattern chosen, the first plate 42 and second plate 44 may be vertically translated toward and away from the other plate to adjust the pumping characteristics. Additionally, rotating the first plate 42 and second plate 44 with respect to each other, or a combination of rotation and translation, may be employed. Alternatively, "pie shaped" or other geometries of commercially available throttling valves may be utilized. The configuration of the first plate 42 and second plate 44 as shown in FIG. 1 depicts a relatively unrestricted flow path, as shown in open detail 48.

Figure 2:
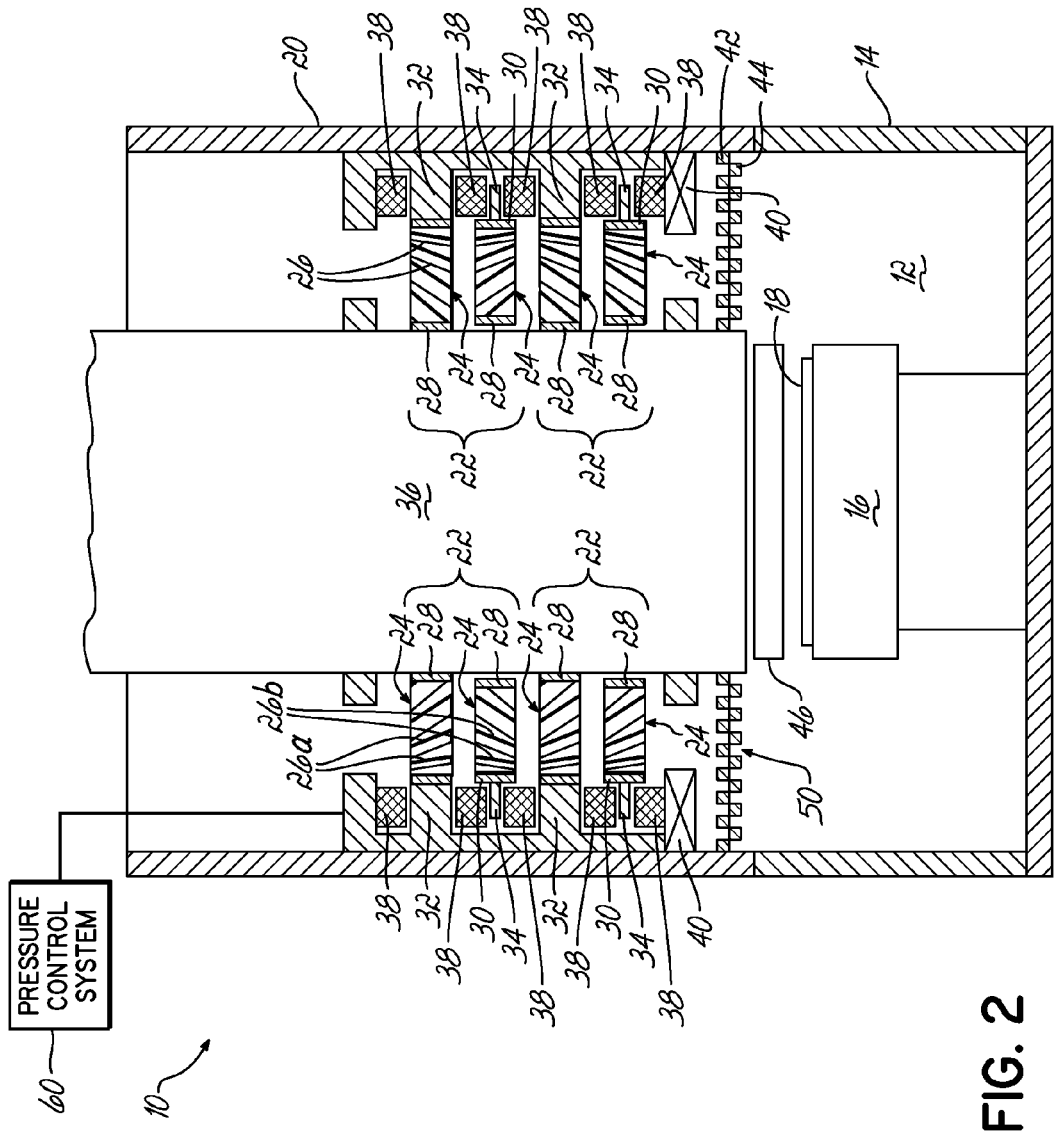
FIG. 2 is a cross sectional view of one embodiment of the disclosed processing chamber integrated pressure control, with movable pump and plate valve in a second position.

FIG. 2 depicts the same elements as shown in FIG. 1, but the elements have been adjusted to produce a different pumping configuration. The stages 22 of vane assemblies 24 have been linearly translated closer to the substrate holder 16. This configuration effectively reduces the volume of the processing space 12, as compared to the configuration in FIG. 1. Additionally, the first plate 42 and second plate 44 have been placed in close proximity, and therefore result in significantly restricted pumping flow, as shown in closed detail 50. In some embodiments, the first plate 42 may be mounted to the stack of stages 22, whereby linear motion of the stages 22 simultaneously translates the first plate 42.

In addition to adjusting pumping characteristics with various throttle valves and linear translation of the stages 22, other methods may be employed. In some embodiments, the pitch, or angle of the stator vanes 26a may be adjusted. The angle of the stator vanes 26a, with respect to the angle of the compressor vanes 26b, will effectively vary the pumping forces. Also the profile or surface area of the stator vanes 26a or compressor vanes 26 may be adjusted. In some embodiments, the pitch of the compressor vanes 26b may be non-constant, whereby the pitch is more steep near the center ring 28 or perimeter ring 30 of the compressor 34. As recognized by those skilled in the art, adjustments to the features of the stator 32 may be equally applied to features of the stator 32 and compressor 34. Furthermore, the characteristics of the stator vanes 26a and compressor vanes 26b may be configured prior to a pumping operation, or may be adjusted during a pumping operation.

Because the compressors 34 are independently driven and levitated, the pumping characteristics of each stage 22 may be controlled as desired. A desired pressure, that is selected to produce favorable conditions for a given process, may be referred to as the target pressure. In some embodiments, each stage 22 is driven at the same speed, while in other embodiments, some stages 22 may be rotated faster or slower than other stages to produce required pumping effects. The rotational speed may be reduced to zero, and therefore some stages may be effectively disengaged from the pumping action. In addition to independently adjusting the rotational speed, compressors 34 may be selectively rotated in a reverse direction during certain pumping operations.

Figure 3:
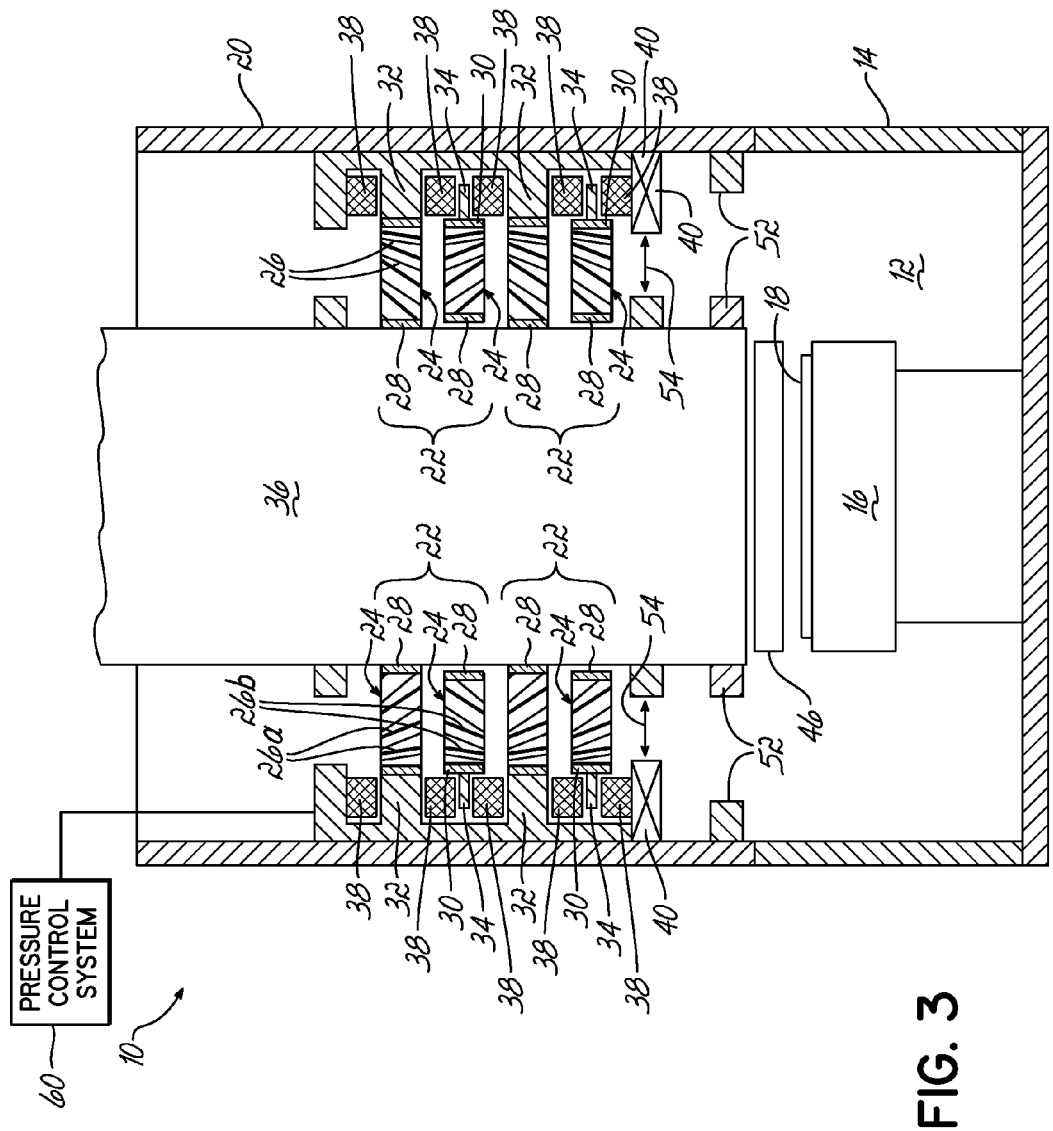
FIG. 3 is a cross sectional view of one embodiment of the disclosed processing chamber integrated pressure control, depicting restricted edge pumping, with moveable pump and baffle in a first position.

In an alternative embodiment, FIG. 3 explores substituting plates 42 and 44 with a baffle 52 that may be used to variably adjust edge pumping characteristics at or near the end of the processing space 12, relative to those characteristics nearer the center of the processing space 12. The baffle 52 is fixedly located near the end of the pump cylinder 20. The orifice 54, formed at the end of the vertically translatable stages 22, serves as a guide for the evacuated contents of the processing space 12. When the stages 22 are in the uppermost position, pumping from the process space is relatively symmetric. The contents near the center of the processing space 12 are evacuated at a rate that is substantially similar to the rate evacuated near the edge of the processing space 12. However, as the stages 22 are vertically translated in the direction of the substrate holder 16, the relative positions of the baffle 52 and orifice 54 begin to result in decreased pumping near the edge of the processing space 12. Similarly, the baffle 52 can alternatively be configured to decrease or otherwise vary pumping near the center of the processing space 12.

Figure 4:
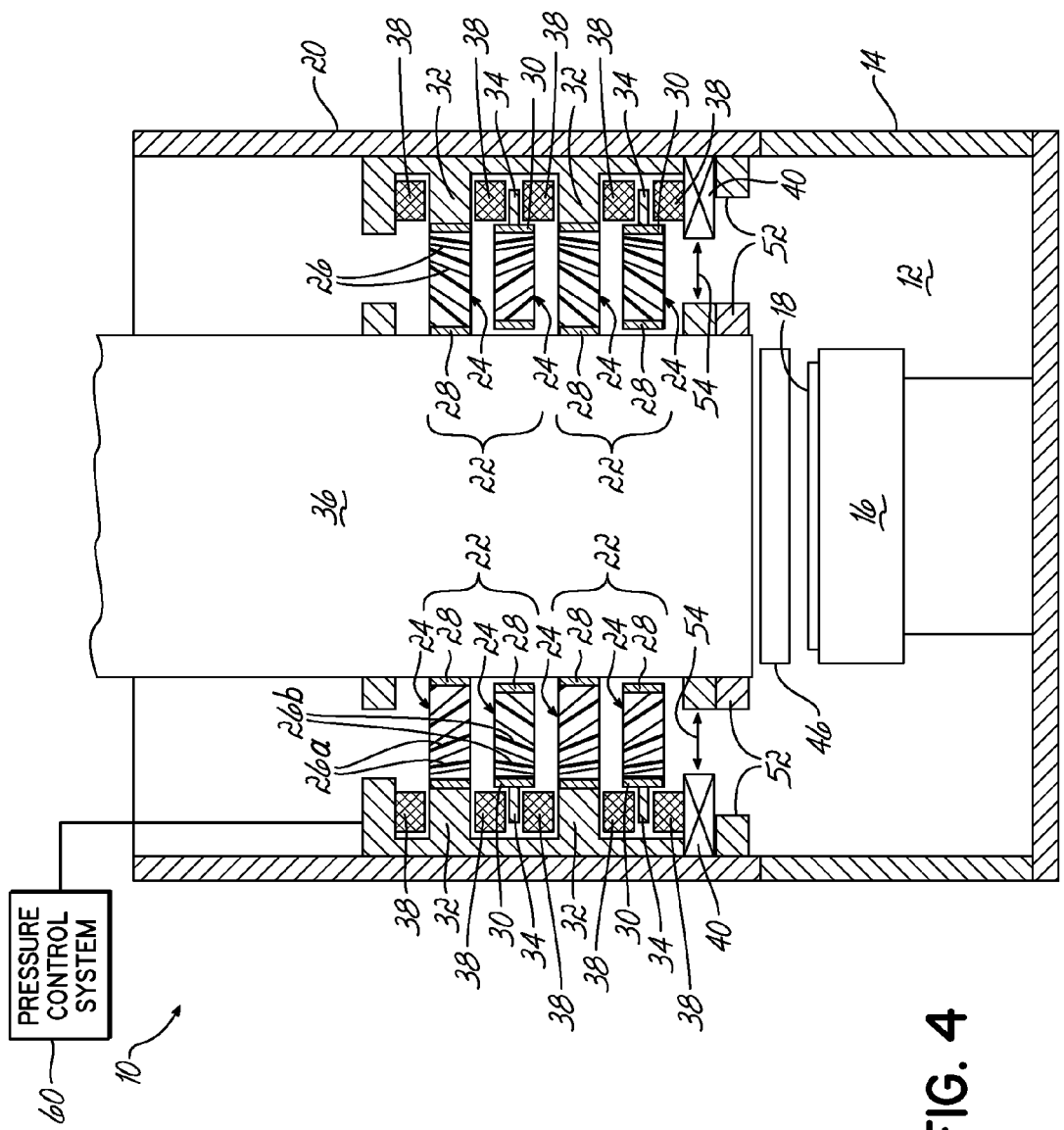
FIG. 4 is a cross sectional view of one embodiment of the disclosed processing chamber integrated pressure control, depicting restricted edge pumping, with moveable pump and baffle in a second position.

FIG. 4 provides further detail to a restricted edge pumping configuration of FIG. 3. In FIG. 4, the stages 22 are fully lowered within the pump cylinder 20, and the baffle 52 and orifice 54 are in near-contact with each other. The edge pumping is most fully restricted in this configuration. The dimensions of the baffle 52 and orifice 54 may be selected to produce the desired characteristics at various vertically translated positions, to include fully restricted and fully open configurations. The dimensions of the baffle 52 and orifice 54 may be fixed, or may be adjusted by utilizing a variable aperture structure.

Figure 5:
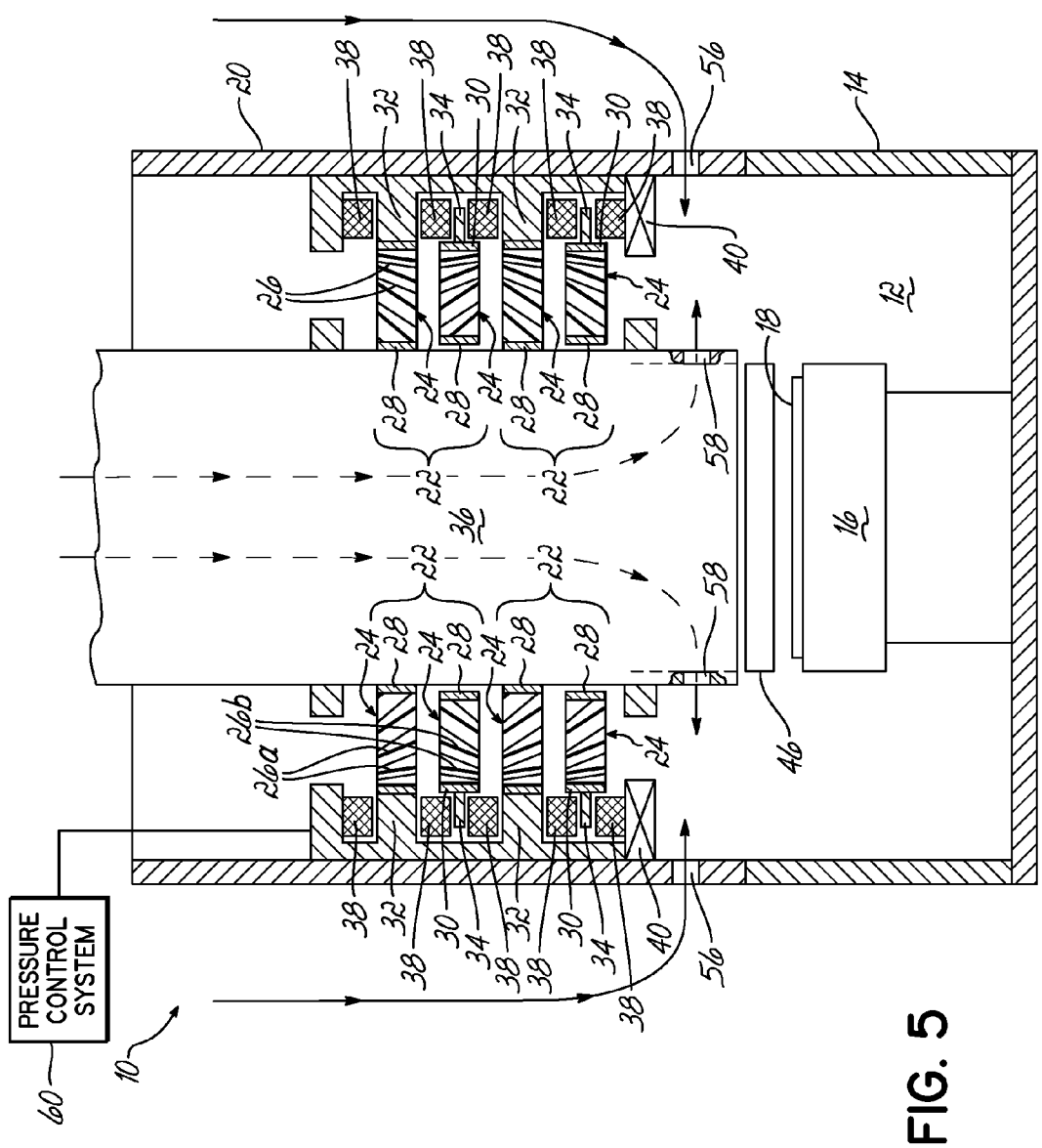
FIG. 5 is a cross sectional view of one embodiment of the disclosed processing chamber integrated pressure control, depicting manipulation of pressure regions by injecting gasses behind a baffle.

FIG. 5 discloses an additional embodiment of radial pumping control. In this embodiment, one or more perimeter injection ports 56 and center injection ports 58 are included. During pumping operations, injection of gas may be used to adjust the pumping characteristics. As positive pressure gas is introduced, net vacuum forces in that region are counterbalanced and effectively reduced. For example, injecting gas through the perimeter injection ports 56 will tend to result in reduced edge pumping. Reducing the gas introduced through the perimeter injection ports 56, or by injecting gas through the center injection ports 58, will tend to reduce center pumping characteristics. By controlling the pressure and volumes of injected gas, the desired pumping traits may be selected.

Figure 6:
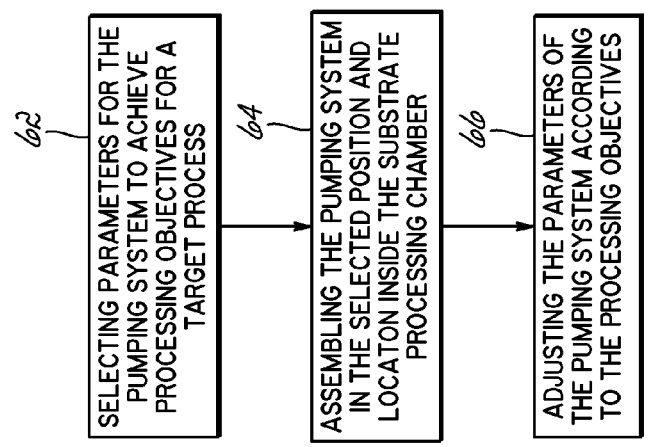
FIG. 6 is a flowchart illustrating a method of integrating and controlling a pumping system.

Each of the variable elements noted above may be manually configured by a user. Additionally, each of the adjustable elements may be automatically adjusted by a pressure control system 60, prior to, or during a pumping operation. FIG. 6 illustrates one embodiment of a method of integrating and controlling a pumping system. The embodiment of the method includes a first step 62, of selecting parameters for the pumping system to achieve processing objectives for a target process; a second step 64, of assembling the pumping system in the selected position and location inside the substrate processing chamber; and a third step 66, of adjusting the parameters of the pumping system according to the processing objectives By selecting appropriate parameters noted above, and by assembling the pumping system in a selected position and location within the substrate processing space 12 to produce a desirable range of processing environments, the quality and yield of processed semiconductors will be improved. Furthermore, the enhanced variability found in embodiments of the disclosed pumping system allow for adjusting of parameters both before, and during, a given processing step to achieve processing objectives. This allows for rapid accommodation of varied process recipes, and the ability to adjust pumping conditions in real-time. As one of ordinary skill in the art will recognize, the disclosed apparatus may function as a stand-alone unit, or may be configured in a wafer fabrication track cluster, wafer fabrication deposition cluster, or wafer fabrication etch cluster.

Although only certain embodiments of this invention have been described in detail above, those skilled in the art will readily appreciate that many modifications are possible in the embodiments without materially departing from the novel teachings and advantages of this invention. For example, while the figures and disclosure has focused on a top-pumping configuration, the invention is equally suited to bottom-pumping and may be modified to achieve the benefits thereof. Accordingly, all such modifications are intended to be included within the scope of this invention.

The invention claimed is:

1. A semiconductor fabrication apparatus with integrated processing chamber pressure control, comprising:
   a substrate processing chamber configured to perform one or more processes in semiconductor fabrication; and
   an integrated pumping system concentrically mounted within the substrate processing chamber and movable axially within the substrate processing chamber, wherein the pumping system comprises:
      a turbo pump suspended inside the substrate processing chamber, the turbo pump having a hollow central shaft and one or more stages, each of the one or more stages having stator vanes fixed relative to the pumping system and compressor vanes rotatable about a central axis of the stator vanes, and
      a pressure control system coupled to the turbo pump and configured to adjust the pressure within the substrate processing chamber by changing the relative motion or position of the turbo pump or a component thereof relative to the substrate processing chamber.

2. The apparatus of claim 1 further comprising:
   a levitation system coupled to the turbo pump and configured to suspend the turbo pump or a component thereof at a first location within the substrate processing chamber.

3. The apparatus of claim 2 wherein the levitation system is electrical or magnetic levitation or a combination of electrical and magnetic levitation.

4. The apparatus of claim 2 wherein the pressure control system is operative to adjust the pressure within the substrate processing chamber by adjusting the angle of the stator vanes or the compressor vanes.

5. The apparatus of claim 2 wherein the pressure control system is configured to adjust the pressure within the substrate processing chamber by adjusting the size or profile of the stator vanes or the compressor vanes.

6. The apparatus of claim 2 wherein the pressure control system is configured to adjust the pressure within the substrate processing chamber by adjusting a rotational speed of the turbo pump.

7. The apparatus of claim 2 wherein the pressure control system is configured to adjust the pressure within the substrate processing chamber by engaging, disengaging, or varying a rotational speed of the stages.

8. The apparatus of claim 2 wherein each of the stator and compressor vanes includes a first end situated near the center axis and a second end located radially outward from the center axis, and wherein each of the stator and compressor vanes is configured with a steeper angle near either the first end or the second end.

9. The apparatus of claim 2 wherein the turbo pump is movable in a vertical direction to adjust the pressure.

10. The apparatus of claim 2, further comprising a valve comprised of two or more cooperating valve plates disposed in a space exterior to an outer face of the central hollow shaft, wherein the cooperating valve plates include a pattern of punched geometric features and are configured to translate axially or rotationally within the substrate processing chamber.

11. The apparatus of claim 10, wherein at least one of the two or more valve plates is mounted to an end of the turbo pump.

12. The apparatus of claim 2 wherein the turbo pump is disposed in the substrate processing chamber for top pumping, bottom pumping, or both.

13. The apparatus of claim 2 further comprising a showerhead and gas injection system disposed within the substrate processing chamber, wherein the gas injection system is configured to inject a gas in a space between the showerhead and the turbo pump.

14. The apparatus of claim 2, including a cooperating orifice and baffle disposed between the turbo pump and the processing chamber, wherein a relative position between the orifice and baffle serves to restrict or allow pumping in a radial region of the processing chamber.

* * * * *